(12) United States Patent
Kusumoto et al.

(10) Patent No.: US 8,242,592 B2
(45) Date of Patent: Aug. 14, 2012

(54) IC CHIP, ANTENNA, AND MANUFACTURING METHOD OF THE IC CHIP AND THE ANTENNA

(75) Inventors: Naoto Kusumoto, Isehara (JP); Takuya Tsurume, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/053,241

(22) Filed: Mar. 22, 2011

(65) Prior Publication Data

US 2011/0171776 A1    Jul. 14, 2011

Related U.S. Application Data

(62) Division of application No. 11/667,072, filed as application No. PCT/JP2005/020664 on Nov. 4, 2005, now Pat. No. 7,928,554.

(30) Foreign Application Priority Data

Nov. 9, 2004    (JP) ................................. 2004-324948

(51) Int. Cl.
    *H01L 23/48* (2006.01)
(52) U.S. Cl. ................. 257/692; 257/E31.117; 438/110
(58) Field of Classification Search .................. 257/692, 257/E31.117; 438/110
    See application file for complete search history.

(56) References Cited

U.S. PATENT DOCUMENTS

| | | |
|---|---|---|
| 6,441,736 B1 | 8/2002 | Leighton |
| 6,478,229 B1 | 11/2002 | Epstein |
| 6,635,968 B2 | 10/2003 | Usami |
| 6,867,478 B2 | 3/2005 | Usami |
| 7,070,114 B2 | 7/2006 | Cho |
| 2005/0173541 A1* | 8/2005 | Inoue et al. .................. 235/492 |

FOREIGN PATENT DOCUMENTS

| | | | |
|---|---|---|---|
| JP | 04-271603 | | 9/1992 |
| JP | 05-074624 | | 3/1993 |
| JP | 05-074642 | | 3/1993 |
| JP | 05074624 A | * | 3/1993 |
| JP | 2001-185940 | | 7/2001 |
| JP | 2001-217380 | | 8/2001 |
| JP | 2002-352203 | | 12/2002 |

OTHER PUBLICATIONS

International Search Report (Application No. PCT/JP2005/020664) dated Feb. 14, 2006. Written Opinion (Application No. PCT/JP2005/020664) dated Feb. 14, 2006.
European Search Report (Application No. 05803180.8) dated Dec. 7, 2010.

* cited by examiner

*Primary Examiner* — Thao Le
*Assistant Examiner* — Matthew Gordon
(74) *Attorney, Agent, or Firm* — Eric J. Robinson; Robinson Intellectual Property Law Office, P.C.

(57) ABSTRACT

An antenna used for an ID chip or the like is disclosed with planarized antenna unevenness and an IC chip having such the antenna with a flat surface is disclosed. Manufacturing an integrated circuit mounted with an antenna is facilitated. A laminated body formed by stacking a conductive film 11, a resin film 13, an integrated circuit 12, and a resin film 14 are rolled so that the resin film 14 is outside. Then, the laminated body is integrated in a roll form by softening the resin films 13, 14 by applying heat. By slicing the rolled laminated body along with the direction in which the rolled conductive film 31 appears in the cross section, an IC chip with antenna formed by the rolled conductive film 11 is formed.

12 Claims, 13 Drawing Sheets

IC CHIP, ANTENNA, AND MANUFACTURING METHOD OF THE IC CHIP AND THE ANTENNA

TECHNICAL FIELD

The present invention relates to an IC chip having an antenna for receiving, sending, or transmitting bi-directionally data wirelessly such as a wireless chip, a wireless IC, a RFIC, or an IC tag, and a method for manufacturing the IC chip. Further, the present invention relates to an antenna employed for an IC chip which receives, sends, or transmits bi-directionally data wirelessly, and a method for manufacturing the antenna.

BACKGROUND ART

In recent years, an IC having a function of wirelessly transmitting data such as a wireless tag, an IC tag, or a noncontact IC card has been actively developed. Both of the IC tag and the noncontact IC card require an antenna for transmitting data wirelessly.

There is a built-in antenna in which an antenna is formed directly on an IC chip, and an external antenna in which an antenna is formed over a base material different from an IC chip. An external antenna coil is the mainstream of an antenna since it can extend communication distance due to its large antenna.

As a method for manufacturing an external antenna, a method employing etching, a printing method, or the like is known. In the case of etching, metallic foil such as copper or aluminum formed over a plastic substrate by vapor deposition or pasting is formed into a desired shape by a photolithography process and an etching process. In the case of printing, conductive polymer is printed on a film-like base material into the shape of an antenna coil by technique such as a screen printing method.

DISCLOSURE OF INVENTION

A wiring serving as an antenna is formed over an insulating base material. The wiring requires a thickness of several ten micro millimeters from the viewpoint of electric resistance. Therefore, unevenness due to the wiring becomes comparatively large, which may lead to restriction on a sealing mode of an antenna or a mode of a product itself mounted with an antenna. Further, a foreign material becomes easily mixed between wirings of an antenna. As a result, electric characteristics and manufacturing yields become easily made to be deteriorated. In order to solve such the problem, an insulating material is made to fill a concave portion between wirings of an antenna to smooth the surface of the antenna.

As a method for forming the insulating material, there is a method of depositing an inorganic insulating film by a CVD method or the like; however, it is difficult to selectively deposit the inorganic insulating film over only the concave portion between wirings. Therefore, a different process such as an etch back method is required. Further, there is a method of coating an organic resin material; however, there is a problem that a connecting terminal becomes difficult to be formed or sensitivity of an antenna is deteriorated since a wiring has a thickness of several ten micro millimeters and the organic resin film is required to be made thicker.

In the case of an external antenna, a process of mounting an antenna to an integrated circuit is additionally required. As a result, necessary materials or devices are increased, which is one of the factors that do not reduce costs.

In view of the foregoing, it is an object of the present invention to provide an antenna having flat surfaces (both of a top surface and a bottom surface) without steps due to wirings, and an IC chip having such the antenna.

It is another object of the present invention to provide an IC chip which facilitates manufacturing of an antenna and mounting an antenna to an integrated circuit, and a method for manufacturing the IC chip.

An IC chip according to the present invention is formed by rolling a laminated body formed by stacking at least a strip-like or line-like conductive film, a first resin film, an integrated circuit, and a second resin film so that the second resin film is outside wherein the strip-like or line-like conductive film is electrically connected to the integrated circuit.

The surface of the IC chip according to the present invention is covered by a first and second resin films. The first and the second resin films are preferably formed by films made from the same materials since the first and the second resin films can have the same coefficients of thermal expansion.

In the IC chip according to the present invention, two or more layers of the conductive films and two or more layers of the integrated circuits can be formed in the laminated body. In that case, the resin film can be interposed between the conductive films, between the integrated circuits, or between the conductive film and the integrated circuit. Further, the laminated body can be rolled so that the resin film is the front.

A method for manufacturing an IC chip according to the present invention comprising the steps of: rolling a laminated body formed by stacking a conductive film, a first resin film, a plurality of integrated circuits, and a second resin film or a laminated body formed by stacking an integrated circuit, a first resin film, a strip-like or line-like conductive film, and a second resin film so that the second resin film is outside; fixing the laminated body in a roll form in a state that the conductive film is electrically connected to the integrated circuit by softening the first resin film and the second resin film; and cutting the laminated body along with a direction in which a roll of the laminated body appears in a cross-section.

The conductive film is sheet-like in the foregoing method for manufacturing an IC chip.

The conductive film is formed in a line or strip in the foregoing method for manufacturing an IC chip.

According to the method for manufacturing an IC chip according to the present invention, two or more layers of conductive films and two or more layers of integrated circuits can be formed in the laminated body. In that case, the resin film can be interposed between the conductive films, between the integrated circuits, or between the conductive film and the integrated circuit. Further, the laminated body is rolled so that the resin film becomes a surface.

An antenna according to the present invention is formed by rolling a laminated body formed by stacking at least one layer of a resin film and one layer of a strip-like or line-like conductive film. Further, the antenna according to the present invention is formed by rolling a laminated body formed by stacking a resin film and a strip-like or line-like conductive film wherein a surface of the conductive film is covered by the resin film except a connecting portion of the conductive film.

Two or more layers of conductive films can be stacked in the antenna according to the present invention. In that case, the resin film can be interposed between the conductive films, between the integrated circuits, or between the conductive film and the integrated circuit. When using a plurality of resin films, the resin films are preferably formed by the same materials in order to have the same thermal expansion coefficients.

A method for manufacturing an antenna comprising the steps of: rolling a laminated body formed by stacking a resin film and a conductive film; fixing the resin film and the conductive film by softening the resin film; and cutting the laminated body along with a direction in which a roll of the conductive film appears in a cross-section.

The conductive film is sheet-like in the foregoing method for manufacturing an antenna. The conductive film is formed by arranging a plurality of strip-like or line-like second patterns in parallel between a pair of strip-like or line-like first patterns in the method for manufacturing an antenna.

Two or more layers of conductive films can be stacked via a resin film in the method for manufacturing an antenna according to the present invention. In that case, a laminated body is rolled so that the resin film becomes a surface.

Since the conductive film and the resin film are rolled in the IC chip according to the present invention, a concave portion of the conductive film serving as an antenna can be filled with the resin film, and so a foreign material is not mixed between wirings of the antenna. Further, a top surface and a bottom surface of the IC chip are flat. Therefore, the IC chip becomes easily mounted to a product. In addition, an IC chip with an antenna can be mounted to a product without detracting from appearance or beauty.

According to the present invention, an IC chip with an antenna can be manufactured by an extremely simple method of cutting a rolled laminated body in which an integrated circuit and a conductive film are electrically connected to each other. Therefore, manufacturing of the antenna and mounting the antenna to the integrated circuit can be carried out in the sequence of a manufacturing process. Further, an IC chip having flat top and bottom surfaces mounted with an antenna can be easily manufactured according to the present invention.

Since a conductive film and a resin film are rolled in an antenna according to the present invention, a concave portion of a conductive film serving as an antenna can be filled with the resin film. Therefore, top and bottom surfaces of the antenna are flat.

According to the present invention, an antenna can be formed by an extremely simple method of rolling a conductive film and a resin film and cutting the roll. According to the manufacturing method of the present invention, a concave portion of a conductive film serving as an antenna can be filled with the resin film. Therefore, top and bottom surfaces of the antenna are flat since the concave portion of a conductive film serving as an antenna can be filled with the resin film and a foreign material can be prevented from mixing between wirings in the antenna in accordance with the present invention. Since the both surfaces of the antenna have the same shapes, a process for mounting the antenna to the integrated circuit can be easily carried out. Further, integrated circuits can be mounted to the both surfaces of the antenna.

BEST MODE FOR CARRYING OUT THE INVENTION

Embodiment 1

Hereinafter, the present invention is explained in the following embodiments. It is to be understood that various changes and modifications of materials, sizes, manufacturing methods, and the like, or various combinations thereof in each of the embodiments will be apparent to those skilled in the art without departing from the spirit of essential characteristics of the present invention.

A method for manufacturing an IC chip with an antenna is explained in this embodiment with reference to FIGS. 1 to 6.

Figure 1:
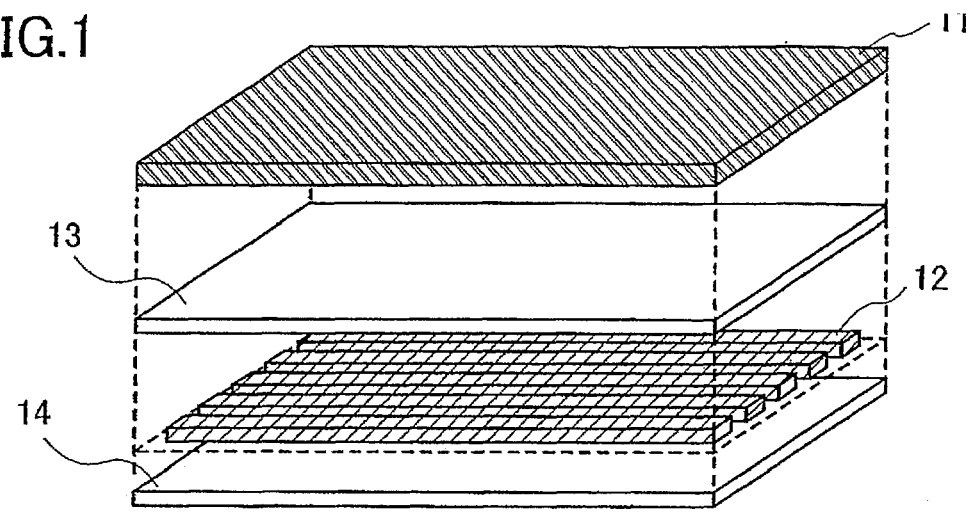
FIG. 1 is an explanatory view for showing a method for manufacturing an IC chip with an antenna (Embodiment 1)

A sheet-like conductive film 11 for forming a wiring of an antenna, a plurality of integrated circuits 12, and resin films 13, 14 for fixing an antenna to the integrated circuits are prepared. As illustrated in FIG. 1, the conductive film 11, the resin film 13, the integrated circuits 12, and the resin film 14 are sequentially stacked.

As the conductive film 11, metallic foil of copper, aluminum, or the like can be used. A line width of the antenna is conclusively defined depending on a thickness of the conductive film 11. The conductive film may be formed to have a thickness of 90 to 150 μm.

Figure 2A:
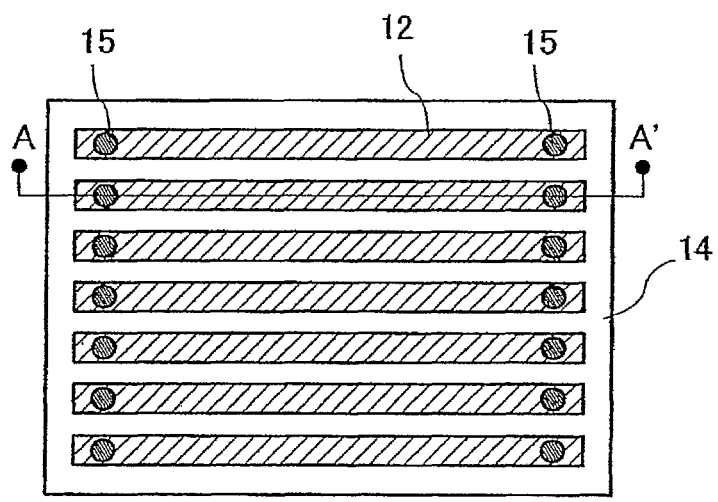
FIGS. 2A and 2B are a top view and a cross-sectional view of an integrated circuit (Embodiment 1)
Figure 2B:
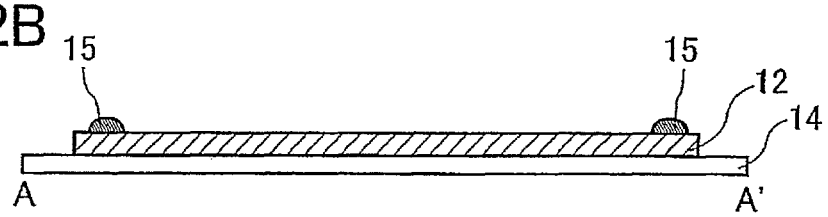

FIG. 2A is a top view of the integrated circuits 12 formed over the resin film 14. FIG. 2B is a cross-sectional view of the integrated circuits 12 illustrated in FIG. 2A taken along line A-A'. A plurality of the integrated circuits 12 is formed over the resin film 14. The integrated circuits 12 are formed into strip shapes or line shapes so as to be rolled eventually. Connecting portions 15 for connecting an antenna are provided at both ends of the integrated circuits 12. Hemispherical bumps are used as the connecting portions 15 in this embodiment; however, it is not limited to the shape. For example, pointed wedge shaped bumps can be employed.

The integrated circuits 12 are mainly composed of a power source unit and a logic unit having a CPU and a memory. The power source unit is composed of a rectification circuit for producing a power source with a signal received by an antenna, a retention volume for holding a produced power source, and the like. The logic unit is composed of a demodulation circuit for demodulating a received signal, and a clock circuit for generating a clock signal, an identification/determination circuit for identifying each code or determining, a memory controller for producing a signal which is used to read out data from a memory by the received signal, an encoding circuit for encoding data which is read out from the memory, a modulation circuit for putting an encoded signal on the received signal, and a mask ROM for holding data.

As a method for manufacturing the integrated circuits 12, a method that integrated circuits formed by an organic TFT, an amorphous TFT (thin film transistor), a microcrystalline TFT (thin film transistor), or the like is directly formed over the resin film 14 can be formed; alternatively, a method that integrated circuits formed mainly by a crystalline silicon TFT (thin film transistor) over a substrate instead of the resin film 14 such as a glass substrate or a quartz substrate, and the substrate used for manufacturing and the integrated circuits are separated from each other, then, the separated integrated circuits are fixed to the resin film 14 can be used. The latter method is described later in Embodiments 5 and 6.

The integrated circuits 12 are formed over the resin film 14; however, a flexible substrate can be used instead of the resin film 14. As the flexible substrate, a film made from plastic such as PET (polyethylene telephtharate), PEN (polyethylene naphthalate), or PES (polyether sulfone); or a film made form synthetic resin such as acrylic can be used.

As the resin films 13, 14, resin which is softened by being applied with energy such as heat or ultraviolet ray and which is hardened again as will hereinafter described is used in order to connect the conductive film 11 to the integrated circuits 12. Typically, a thermoplastic resin film and a hot melt sheet can be used. In the following embodiments including this embodiment, an example of using the thermoplastic resin film is used for the resin films 13, 14.

As the thermoplastic resin film, a film-like base material, for example, polyolefin resin such as polyethylene, polypropylene, or polymethylpentene; vinyl copolymer such as vinyl chloride, vinyl acetate, vinyl chloride-vinyl acetate copolymer, ethylene-vinyl acetate copolymer, vinylidene chloride, polyvinyl butyral, or polyvinyl alcohol; acrylic resin; polyester resin; urethane resin; cellulosic resin such as cellulose, cellulose acetate, cellulose acetate butyrate, cellulose acetate propionate, or ethyl cellulose; styrene resin such as polystyrene or acrylonitrile-styrene copolymer can be used.

Figure 3:
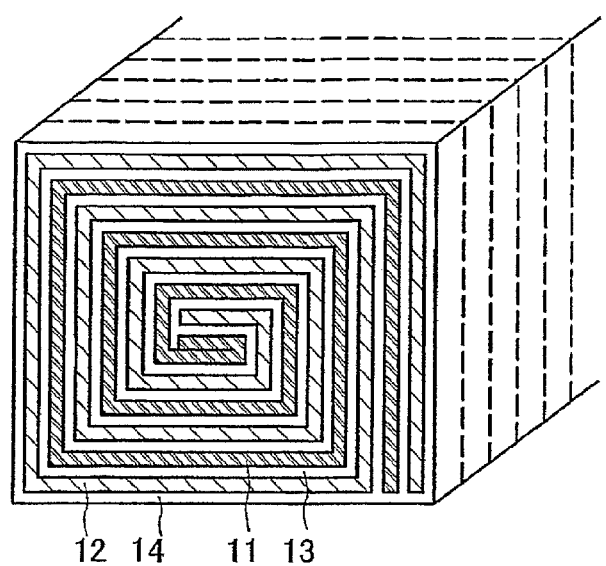
FIG. 3 is an explanatory view for showing a method for manufacturing an IC chip with an antenna (Embodiment 1)

A laminated body formed by stacking the conductive film 11, the resin film 13, the integrated circuits 12, and the resin film 14 is rolled so that the resin film 14 is outside as illustrated in FIG. 3. In that case, it is preferable that the laminated body does not have a cavity in the core. Therefore, the laminated body is rolled after forming a core by rolling the conductive film 11 once or a plurality of times. In FIG. 3, the conductive film 11 is rolled once; however, the number of rolling is not limited thereto. The film serving as a core is not limited to the conductive film 11; any film included in the laminated body can be used. The reason that the conductive film 11 is preferably used is that the conductive film 11 is harder than the resin films 13, 14 and can be rolled easily since it does not have a complicated structure as that of the integrated circuits 12. The resin films 13, 14 are softened by applying energy to the rolled laminated body, and hardened later on. Therefore, the films constituting the laminated body adhere to each other to be fixed in a rolled form.

Since the resin films 13, 14 are made from thermoplastic resin in this embodiment, the laminated body is heated at predetermined temperature to soften the resins films 13, 14. In the state that the resin films 13, 14 are softened, the laminated body is pressure-bonded so that the conductive film 11 is physically connected to the connecting portion 15 of the integrated circuit 12. Since heat is applied to form the rolled laminated body, the resin films 13, 14 are preferably formed by films having the same thermal expansion coefficients.

As illustrated in FIG. 3, the laminated body is fixed to the rolled form by hardening the resin films 13, 14. At this time, the conductive film 11 and the integrated circuits 12 are electrically connected to each other since the conductive film 11 and the connecting portion 15 are physically contact with each other. In this embodiment, a cross section of the roll is a rectangular shape; however, it is not limited to thereto. A round shape, an oval shape, a triangular shape, a polygonal shape, or the like can be employed.

As illustrated in FIG. 3, the laminated body is sliced along with a transverse direction (the direction in which the rolled conductive film 11 or the like appears in the cross-section) by a slicer or a wire saw to form an IC chip 17. A dotted line indicates a slicing position in FIG. 3. When slicing the laminated body, the conductive film 11, the resin films 13, 14 are sliced so that the integrated circuits 12 are not sliced.

Figure 4:
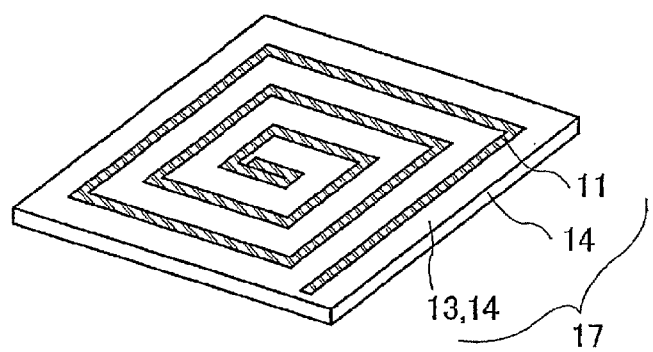
FIG. 4 is a perspective view for showing an exterior of an IC chip with an antenna (Embodiment 1)
Figure 5:
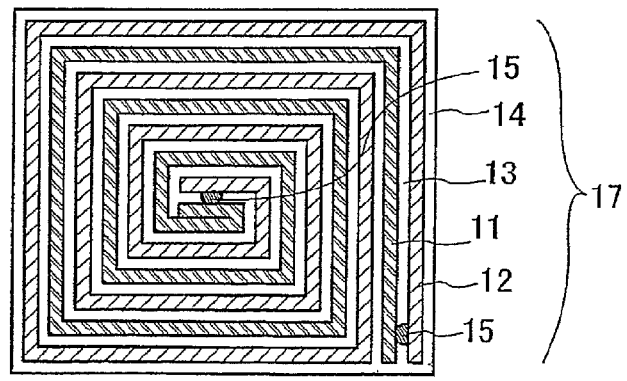
FIG. 5 is a view for showing a transverse section of an IC chip with an antenna (Embodiment 1)

FIG. 4 is an external view of the IC chip 17. FIG. 5 is a cross-sectional view of the IC chip 17 sliced in a transverse direction. As illustrated in FIG. 5, the conductive film 11 is rolled and is electrically connected to the integrated circuits 12 via the connecting portion 15 at a starting point and an ending point of rolling, accordingly, the conductive film 11 serves as an antenna.

As shown in FIG. 4, a surface of the IC chip 17 is mostly covered by the resin films 13, 14. The conductive film 11 is exposed to a top surface and a bottom surface (corresponding to sliced surfaces) of the IC chip 17, and a concave portion due to the scroll-like conductive film 11 is filled with the resin films 13, 14. Therefore, the top surface and the bottom surface of the IC chip 17 are flat.

Figure 6:
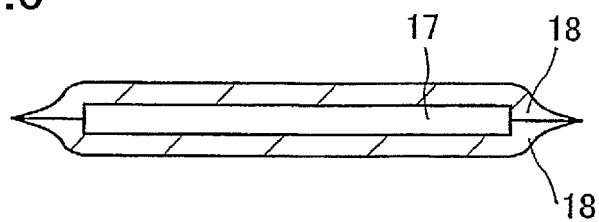
FIG. 6 is an explanatory view for showing a method for manufacturing an IC chip with an antenna (Embodiment 1)

Since the conductive film 11 is exposed to the top surface and the bottom surface of the IC chip 17, the IC chip 17 is preferably sealed with two films 18 as illustrated in FIG. 6. Accordingly, the IC chip 17 becomes easy to be handled and deterioration of the conductive film 11 can be prevented. As the films 18, films made from thermosetting resin are preferably used.

As noted above, the antenna and the integrated circuits can be electrically connected to each other simultaneously with forming the antenna, and so a process becomes simplified and materials and manufacturing devices needed for manufacture can be reduced in accordance with this embodiment.

Embodiment 2

In this embodiment, a method for manufacturing an IC chip is explained in this embodiment with reference to FIGS. 7 to 11. This embodiment is an example of modification of Embodiment 1 and an example of forming preliminarily a conductor serving as an antenna into a predetermined shape.

Figure 8:
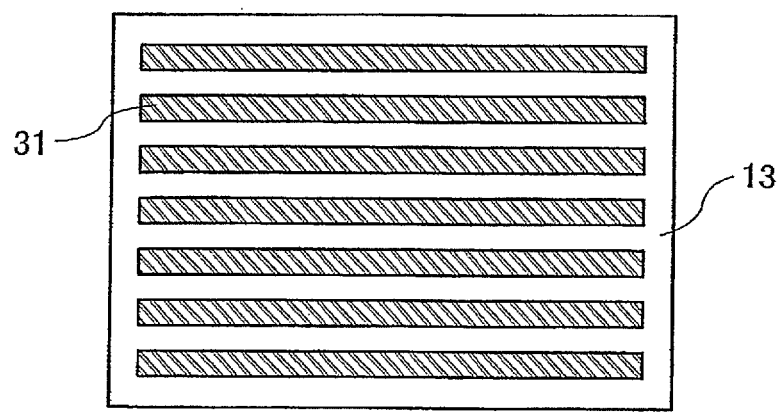
FIG. 8 is a top view of a conductive film (Embodiment 2)

As illustrated in FIG. 8, a plurality of strip-shaped or line-shaped conductive films 31 is formed over a resin film 13. As with Embodiment 1, integrated circuits 12 and resin films 13, 14 for fixing an antenna to the integrated circuits are prepared.

The conductive films 31 can be formed by pasting metallic foil made from copper or aluminum onto a surface of the resin film 13; or depositing a conductive film such as copper or aluminum over the resin film 13 by a sputtering method or a vapor deposition method and etching the obtained conductive film into a line-shape or a strip-shape. Alternatively, the conductive films 31 can be formed by printing or drawing strip-shaped or line shaped conductive resin on a surface of the resin film 13 by a printing method such as a screen printing method or an ink jetting method. As a substratum provided with the conductive films 31, a flexible substrate made from the foregoing material can be used instead of using the resin film 13.

Figure 7:
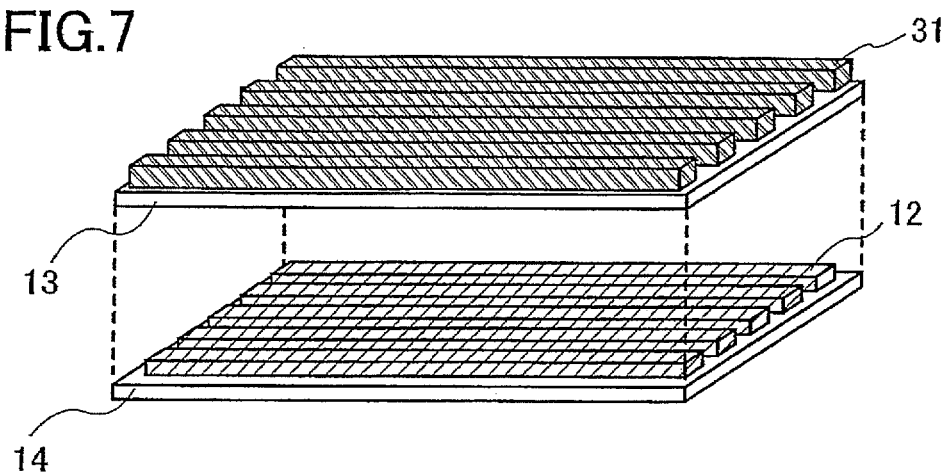
FIG. 7 is an explanatory view for showing a method for manufacturing an IC chip with an antenna (Embodiment 2)

In the following process, as with embodiment 1, an IC chip with an antenna serving as a wireless chip is formed. As illustrated in FIG. 7, the conductive films 31, the resin film 13, the integrated circuits 12, and the resin film 14 are formed sequentially to form a laminated body. In that case, the conductive films 31 and the integrated circuits 12 are sequentially formed over the resin films 13 and 14 so that the conductive films 31 and the integrated circuits 12 are arranged in the same direction and correspond one-to-one.

Figure 9:
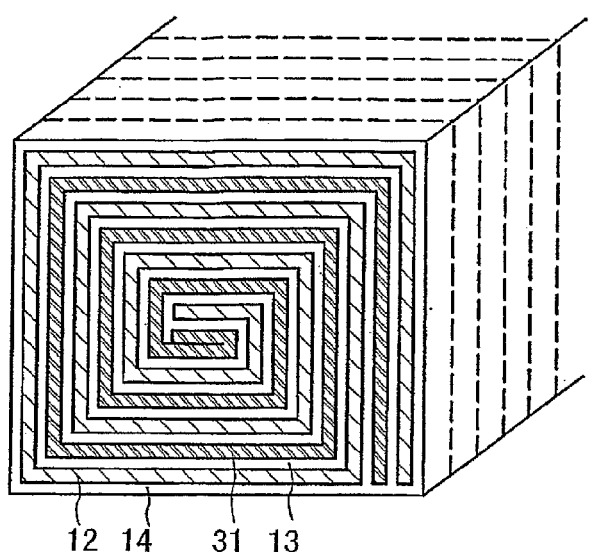
FIG. 9 is an explanatory view for showing a method for manufacturing an IC chip with an antenna (Embodiment 2)

The laminated body is rolled so that the resin film 14 serves as an outer surface. As with embodiment 1, any one of film in the laminated body is preferably rolled to be a core so that laminated body does not have a cavity in the core. As with embodiment 1, the laminated body is rolled centering around a core by rolling the conductive film 31 at a plurality of times. Another film can be used as the core. The rolled laminated body is heated to soften the resin films 13, 14. In the state that the resin films 13, 14 are softened, the laminated body is pressure-bonded so that the conductive film 31 is physically connected to the connecting portion 15 of the integrated circuit 12. The resin films 13, 14 are hardened again, accordingly, a rolled laminated body as illustrated in FIG. 9 can be obtained. In this embodiment, a cross section of the roll is a rectangular shape; however, it is not limited thereto. The cross section can be a round shape, an oval shape, a triangular shape, a polygonal shape, or the like.

Then, the laminated body which is fixed in the roll form is sliced along with the transverse direction (the direction in which the rolled conductive film 31 appears in a cross section) by a slicer, a wire saw, or the like to form an IC chip 37. A dotted line indicates a slicing position. When slicing the laminated body, only the resin films 13, 14 are sliced but the conductive film 31 and the integrated circuits 12.

Figure 10:
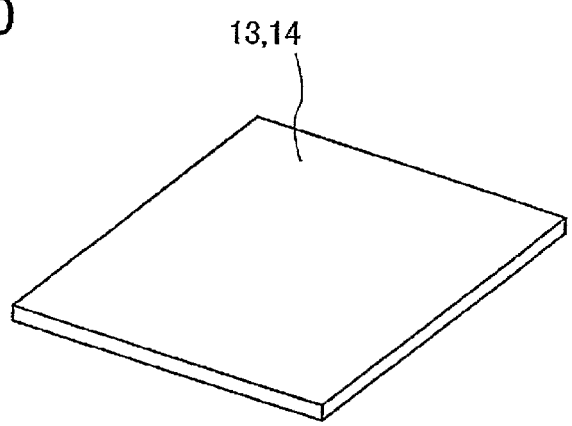
FIG. 10 is a perspective view for showing an exterior of an IC chip with an antenna (Embodiment 1)
Figure 11:
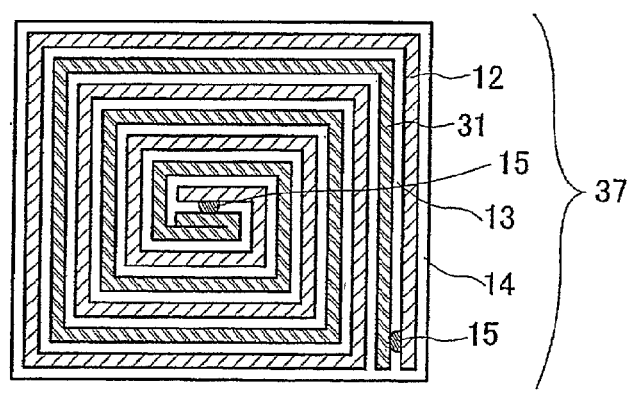
FIG. 11 is a view for showing a transverse section of an IC chip with an antenna (Embodiment 2)

FIG. 10 is an external view of the IC chip 37. FIG. 11 is a cross-sectional view of the IC chip 37 sliced in a transverse direction. As illustrated in FIG. 11, the conductive film 31 is winded in a roll form and electrically connected to the integrated circuits 12 via the connecting portion 15 at a starting point and an ending point of rolling. Accordingly, the conductive film 31 serves as an antenna.

As illustrated in FIG. 10, a manufacturing method that the conductive films 31 and the integrated circuits 12 are rolled together with the resin films 13, 14 and sliced later on is employed for the IC chip 37 in accordance with this embodiment. Concave portions due to both of the conductive films 31 and the integrated circuits 12 are filled with the resin films 13, 14, therefore, a top surface and a bottom surface of the IC chip 37 are flat.

Moreover, an entire surface of the IC chip 37 can be covered by resin films 13, 14, and so the IC chip 37 has higher mechanical strength than that of the IC chip 17 in Embodiment 1 and is easy to be handled. If necessary, the IC chip 37 can be also sealed with films as with Embodiment 1. In that case, thermosetting resin is preferably used as the films. Since the conductive films 31 are preliminarily formed into strip-shapes or line-shapes having narrower widths than that of the IC chip 37, a surface of the IC chip 37 can be covered by the resin films 13, 14.

As noted above, the antenna and the integrated circuits can be electrically connected to each other simultaneously with forming the antenna, and so a process becomes simplified and materials and manufacturing devices needed for manufacture can be reduced in accordance with this embodiment.

In Embodiments 1 and 2, the laminated body is rolled so that the conductive film serving as an antenna is outside and the integrated film is inside. However, the lamination sequence of the conductive film and the integrated film can be reversed and the laminated body can be rolled so that the integrated circuit is outside and the conductive film serving as an antenna is inside.

In Embodiments 1 and 2, the conductive films 11, 31 serving as antennas and the resin films 13, 14 may be formed to have thicknesses which are sufficient to roll the laminated body. For example, each thickness is set to 1 to 500 μm. In Embodiments 1 and 2, a line width of an antenna depends on the thicknesses of the conductive films 11, 31. Therefore, an antenna having a thin line width can be obtained, which was conventionally difficult to be obtained, by reducing the thicknesses of conductive films 11, 31 to 30 to 100 μm, further, 1 to 30 μm. Pitches between antennas are varied depending on the thicknesses of the resin films 13, 14. The resin films 13, 14 are typically formed to have thicknesses of 30 to 50 μm. However, an IC chip having narrow pitches between wirings of an antenna can be easily manufactured by further reducing the thicknesses of the resin films 13, 14 to 1 to 30 μm.

One layered conductive film serving as an antenna and one layered integrated circuit are formed respectively in Embodiments 1 and 2. Two or more layered conductive films and two or more layered integrated circuits can be formed respectively. In that case, the conductive film and the integrated circuit are stacked in no particular order. These films are at least stacked so that a resin film is interposed between the conductive films, between the integrated circuits, or between the conductive film and the integrated circuit; or that the resin film becomes a surface when the laminated body is rolled. In the case that two or more layers of the integrated circuits are employed, all layers of the integrated circuits do not necessarily have connecting portions which connect to the conductive films. Further, all layers of the integrated circuits are not necessarily strip-shapes or line-shapes.

Embodiment 3

A method for manufacturing an antenna and a method for manufacturing an IC chip are explained with reference to FIGS. 12 to 16B in this embodiment.

Figure 12:
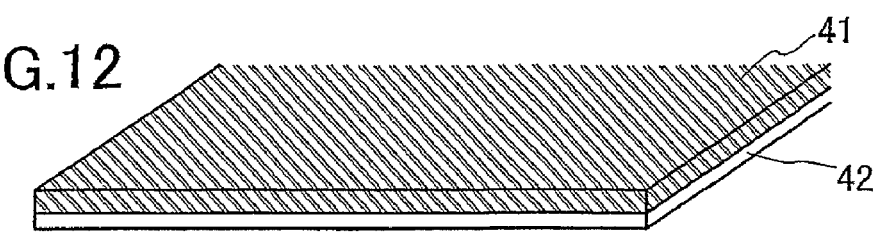
FIG. 12 is an explanatory view for showing a method for manufacturing an antenna (Embodiment 3)

A sheet-like conductive film 41 and a resin film 42 are prepared and stacked as illustrated in FIG. 12. The conductive film 41 is a conductor for forming a wiring of an antenna. As the conductive film 41, a flexible substrate made from resin such as plastic where metallic foil of copper, aluminum, or the like is closely attached to the surface; or where a conductive film such as copper or aluminum is closely attached to the surface by vapor deposition or adhesion bonding can be employed.

The resin film 42 serves as an adhesive agent for forming the conductive film 41 in a roll form and serves as a substratum of an antenna. As the resin film 42, resin which is softened by being applied with energy such as heat or ultraviolet ray, and hardened again is used. Typically, as with Embodiments 1 and 2, a thermoplastic resin film or a hot melt sheet is used. In this embodiment, an example of using a thermoplastic resin film as the resin film 42.

Figure 13:
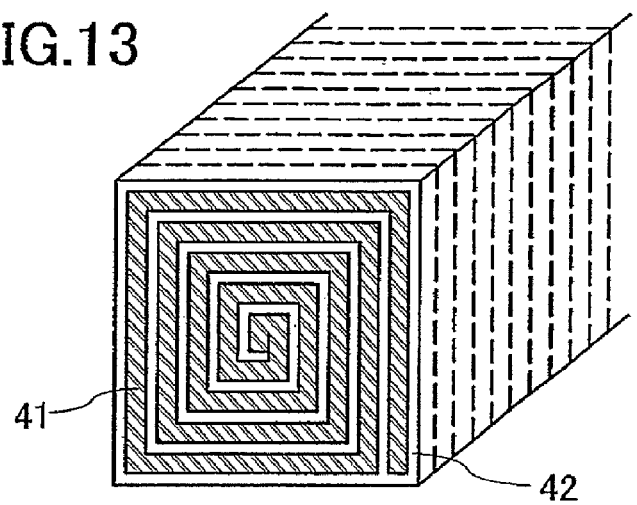
FIG. 13 is an explanatory view for showing a method for manufacturing an antenna (Embodiment 3)

As illustrated in FIG. 13, the laminated body composed of the conductive film 41 and the resin film 42 is rolled so that the resin film 42 is outside. In this embodiment, a cross section of the roll is a rectangular shape; however, it is not limited thereto. The cross section can be a round shape, an oval shape, a triangular shape, a polygonal shape, or the like. It is preferable that the laminated body does not have a cavity in the core. Therefore, the laminated body is rolled after forming a core by rolling the conductive film 41 once or a plurality of times.

The resin film 42 is softened by heating at predetermined temperature and hardened later on. Accordingly, the conductive film 41 and the resin film 42 are stacked to be fixed as a roll form.

As shown in FIG. 13, the rolled laminated body is sliced in a transverse direction (the direction in which the rolled conductive film 41 appears in a cross section) by a slicer, a wire saw, or the like to form a sheet-like or chip-like antenna 45. A dotted line in FIG. 13 indicates a slicing position.

Figure 14:
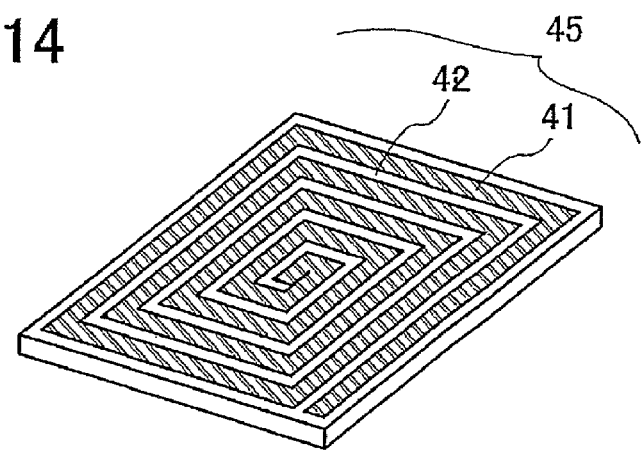
FIG. 14 is a perspective view for showing an exterior of an antenna (Embodiment 3)

FIG. 14 is an external view of the antenna 45. The conductive film 41 is shaped into a roll form or a coil form by the resin film 42 which is hardened. A concave portion due to the scroll-like conductive film is filled with the resin film 42 over a top surface and a bottom surface (surfaces which are cut surfaces) of the antenna 45, accordingly, the top surface and the bottom surface are flat. Therefore, contamination due to a foreign matter penetrated between wirings of an antenna can be prevented. Further, a constraint of a shape on mounting the antenna to an IC chip or the like can be eased. Since the starting point of rolling becomes a connecting portion of an antenna as will hereinafter be described, forming a core by rolling the conductive film 41 once or a plurality of times brings about an effect of enlarging an area of the connecting portion. Since the ending point of rolling also becomes a connecting portion of an antenna as will hereinafter be described, an area of the connecting portion can be enlarged by rolling only the conductive film 41 to be a core at the ending point of rolling like the starting point of rolling.

Figure 15A:
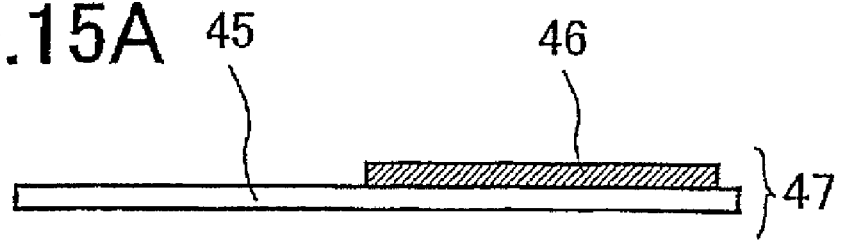
FIGS. 15A and 15B are explanatory views for showing a method for manufacturing an IC chip with an antenna (Embodiment 3)

As illustrated in FIG. 15A, an IC chip 47 with an antenna serving as a wireless chip is formed by mounting an integrated circuit 46 to the antenna 45. When the integrated circuit 46 is mounted to the antenna 45, the vicinity of starting and ending points of rolling of the conductive film 41 are electrically connected to the antenna 45. In the case that the integrated circuit 46 is electrically connected to the antenna 45, a material which does not transform the resin film 42 such as a conductive paste, a conductive film, or the like is used.

Figure 15B:
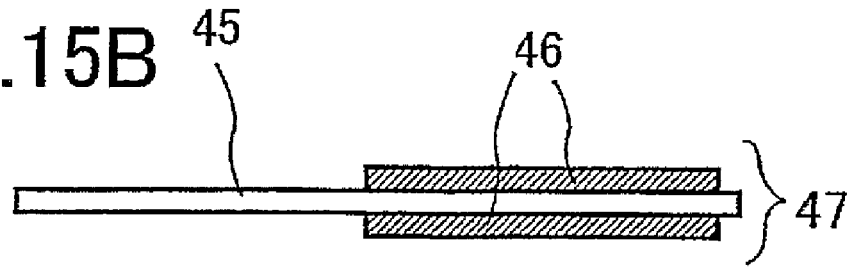

The antenna 45 in accordance with this embodiment has a top surface and a bottom surface (an adverse face and a reverse face) in the same forms, and so alignment for defining an adverse face and a reverse face is not required, which leads to an easy mounting process. Further, the integrated circuits 46 can be mounted to two sides of the antenna 45 as illustrated in FIG. 15B. By mounting the integrated circuits 46 to the two sides of the antenna 45, redundancy can be obtained. Besides, an amount of information capable of being handled can be increased without increasing an exclusive area of the wireless chip. In addition, the wireless chip can be formed to be capable of transmitting information received or detected by one of the integrated circuit 46 to another integrated circuit 46.

Figure 16A:
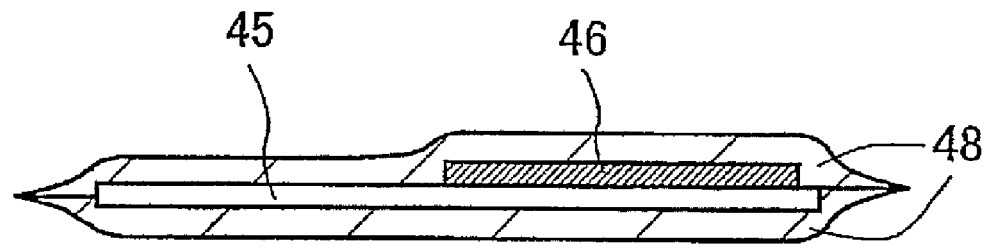
FIGS. 16A and 16B are perspective views for showing an exterior of an IC chip with an antenna (Embodiment 3)
Figure 16B:
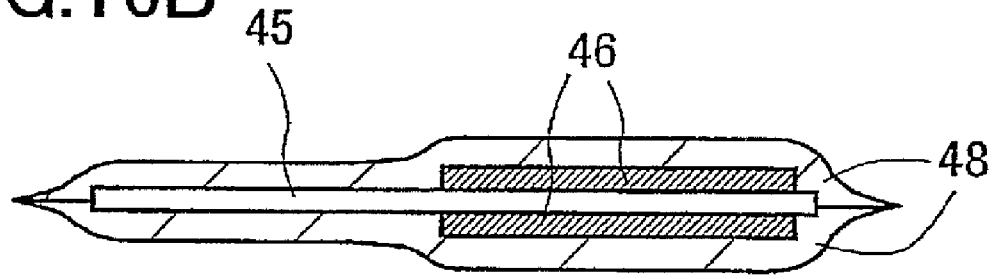

As illustrated in FIG. 16, the obtained IC chip 47 is sealed with two films 48. Accordingly, the IC chip 47 becomes easy to be handled and deterioration can be prevented, since the conductive film 41 is exposed to the top surface and the bottom surface of the antenna 45. As the films 48, films made from thermosetting resin are preferably used.

Embodiment 4

A method for manufacturing an antenna is explained with reference to FIGS. 17 to 21 in this embodiment.

Figure 17:
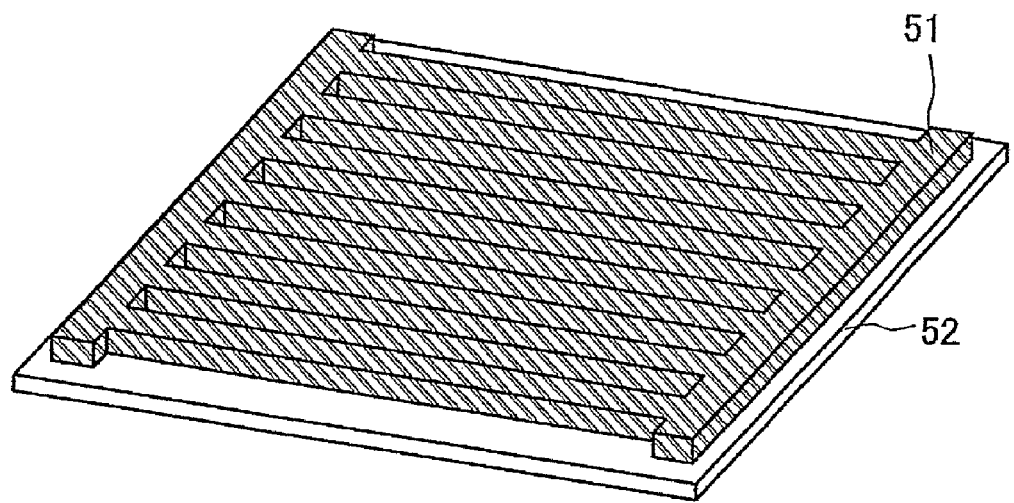
FIG. 17 is an explanatory view for showing a method for manufacturing an antenna (Embodiment 4)

As illustrated in FIG. 17, a conductive film 51 in a predetermined shape is formed over a resin film 52. As the resin film 52, the same film which is used as the resin film 42 in Embodiment 3.

The conductive film 51 is a conductor serving as an antenna. In order to form the conductive film 51 in a predetermined shape, metallic foil made from copper or aluminum is pasted onto a surface of the resin film 52; alternatively, a conductive film such as copper or aluminum is deposited over the resin film 52 by a sputtering method or a vapor deposition method and the obtained conductive film is etched. Further alternatively, the conductive film 51 can be formed by printing or drawing strip-shaped or line-shaped conductive resin on a surface of the resin film 52 by a printing method such as a screen printing method or an ink jetting method.

Figure 18:
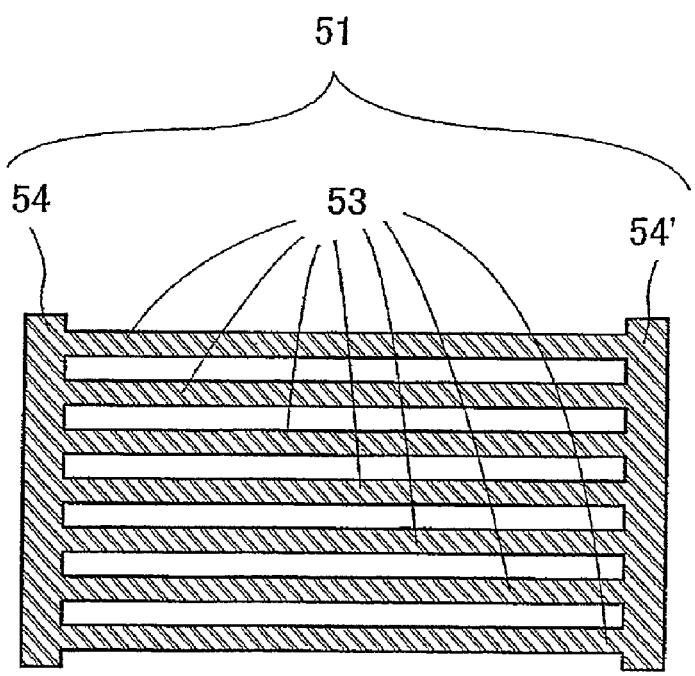
FIG. 18 is a top view of a conductive film (Embodiment 4)

FIG. 18 is a top view for showing the conductive film 51. The conductive film 51 is composed of integration of a plurality of conductive films 53 in line-shapes or strip-shapes and conductive films 54, 54' in line-shapes or strip-shapes which serve as connecting portions of each antenna. That is, the shape of the conductive film 51 is a pattern in which a plurality of patterns in line-shapes or strip-shapes is arranged in parallel between a pair of conductive films in line-shapes or strip-shapes.

Figure 19:
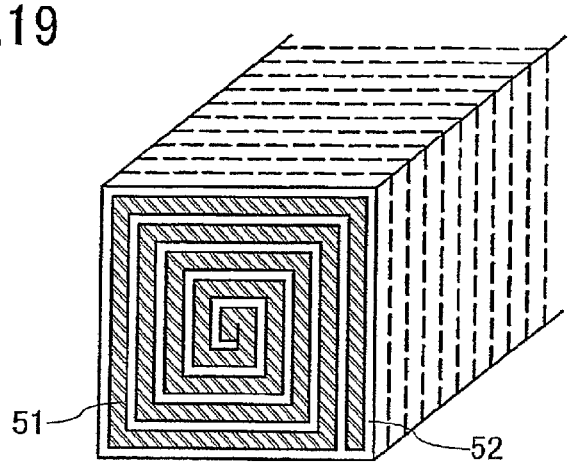
FIG. 19 is an explanatory view for showing a method for manufacturing an antenna (Embodiment 4)

An antenna can be manufactured in accordance with the same manner as that conducted in Embodiment 3. As illustrated in FIG. 19, a laminated body formed by stacking the conductive film 51 and the resin film 52 so that the resin film 52 is outside. In that case, it is preferable that the laminated body does not have a cavity in the core. Therefore, the laminated body is rolled after forming a core by rolling the conductive film 54 of the conductive film 51 once or a plurality of times. In this embodiment, a cross section of the roll is a rectangular shape; however, the cross-section can be formed in an arbitrary shape such as a round shape, an oval shape, a triangular shape, or a polygonal shape.

Then, the laminated body is heated at predetermined temperature to soften the resin film 52. The resin film 52 is hardened later on and the laminated body fixed in a rolled form can be obtained as illustrated in FIG. 19.

The rolled laminated body is sliced along with a transverse direction (the direction in which the rolled conductive film 51 appears in the cross-section) by a slicer or a wire saw to form a sheet-like or a chip-like IC chip 55. A dotted line indicates a slicing position in FIG. 19. When slicing the laminated body, the resin film 52 and the conductive films 54, 54' of the conductive film 51 are sliced so that the conductive film 53 of the conductive film 51 are not sliced. Since the rolling is started from the conductive film 54, it serves as a connecting portion of an antenna. Therefore, forming a core by rolling the conductive film 54 once or a plurality of times brings about an effect of enlarging an area of the connecting portion. Since the ending point of rolling also becomes a connecting portion of an antenna, the conductive film 54' which is an ending point of rolling is preferably formed to be a core by rolling once or a plurality of times like the conductive film 54.

Figure 20:
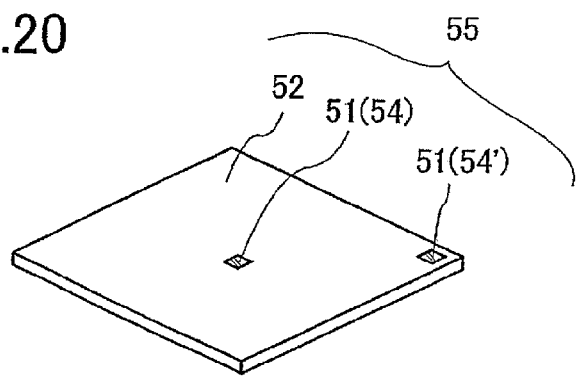
FIG. 20 is a perspective view for showing an exterior of an antenna (Embodiment 4)
Figure 21:
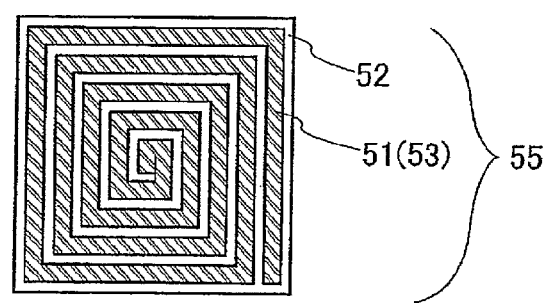
FIG. 21 is a perspective view for showing a transverse section of an antenna (Embodiment 4)

FIG. 20 is an external view of the antenna 55. FIG. 21 is a cross-sectional view for showing the antenna which is sliced in a transverse direction. As illustrated in FIG. 21, the conductive film 53 of the conductive film 51 is shaped in a roll shape or in a coil shape by the hardened resin film 52 to serve as an antenna.

As illustrated in FIG. 20, the antenna 55 is covered by the resin film 52 except portions where starting and ending position of rolling are exposed to top and bottom surfaces of the antenna 55. The exposed portions are the conductive films 54, 54' and serve as connecting portions of an antenna. As noted above, the antenna 55 is entirely sealed with the resin film 52 except the conductive films 54, 54' serving as the connecting portions. Moreover, the antenna 55 has an advantage that the top and bottom surfaces are flat due to that the resin film 52 fills gaps between the conductive films 51. Therefore, the antenna 55 has also advantages of having high mechanical strength and being easy to be handled. Further, a constraint of a shape on mounting can be eased.

This is attributed from the facts that the conductive film 53 serving as an antenna main body is shaped in a line-shape or a strip-shape which is thinner than the thickness of the antenna 55, further, the conductive films 54, 54' are formed so that the conductive film 51 is exposed to any cut surface.

The antenna 55 has the top and bottom surfaces (adverse and reverse surfaces) in the same forms. Therefore, alignment for defining an adverse face and a reverse face is not required, which leads to an easy mounting process. Further, ICs can be mounted to two sides of the antenna 55.

An IC chip is mounted to one surface and both surfaces as with Embodiment 3 to form an IC chip with an antenna serving as a wireless chip by using the antenna 55 in accordance with this embodiment. The obtained antenna chip is sealed with a film made from thermosetting resin according to need.

In Embodiments 3 and 4, the conductive films 41, 51 serving as antennas and the resin films 42, 52 may be formed to have thicknesses which are sufficient to roll the laminated body. For example, each thickness is set to 1 to 500 μm. In Embodiments 3 and 4, a line width of an antenna depends on the thicknesses of the conductive films 41, 51. Therefore, an antenna having a thin line width can be obtained, which was conventionally difficult to be obtained, by reducing the thicknesses of conductive films 41, 51 to 30 to 100 μm, further, 1 to 30 μm. Pitches between antennas are varied depending on the thicknesses of the resin films 42, 52. The resin films 42, 52 are typically formed to have thicknesses of 30 to 50 μm. However, an antenna having narrow pitches between wirings of an antenna can be easily manufactured by further reducing the thicknesses of the resin films 42, 52 to 1 to 30 μm.

Embodiment 5

An example of a method for manufacturing a flexible integrated circuit 12 is explained in this embodiment with reference to FIGS. 22A to 23D. Of course, an obtained integrated circuit can be used as an integrated circuit mounted with an antenna according to Embodiments 3, 4.

A substrate 101 for manufacturing integrated circuits 100 is prepared. Since a thin film integrated circuit 100 manufactured over the substrate 101 is separated from the integrated circuits 100, the substrate 101 can be reused. As the substrate 101, a quartz substrate is preferably used. As the substrate 101, a glass substrate, a quartz substrate, a metallic substrate, or a stainless substrate, each of which is provided with an insulating film over its surface; a plastic substrate having heat resistance capable of withstanding processing temperature in manufacturing; or the like is used.

A thin film serving as a release film 102 is formed over the substrate 101. The release film 102 has a function of making the integrated circuits 100 and the substrate 101 stick together. After completing the integrated circuits 100, the release film 102 is removed without affecting the integrated circuits 100.

Figure 22A:
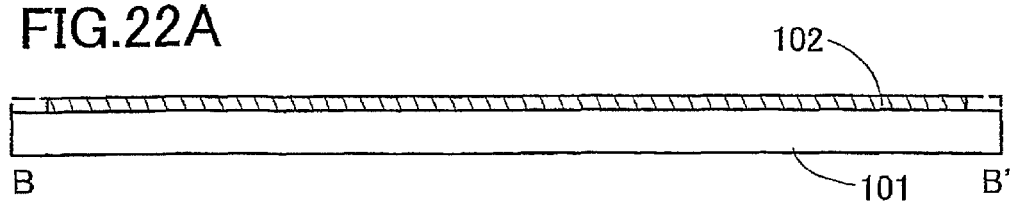
FIGS. 22A to 22E are explanatory views for showing a method for manufacturing a flexible integrated circuit (Embodiment 5)
Figure 22B:
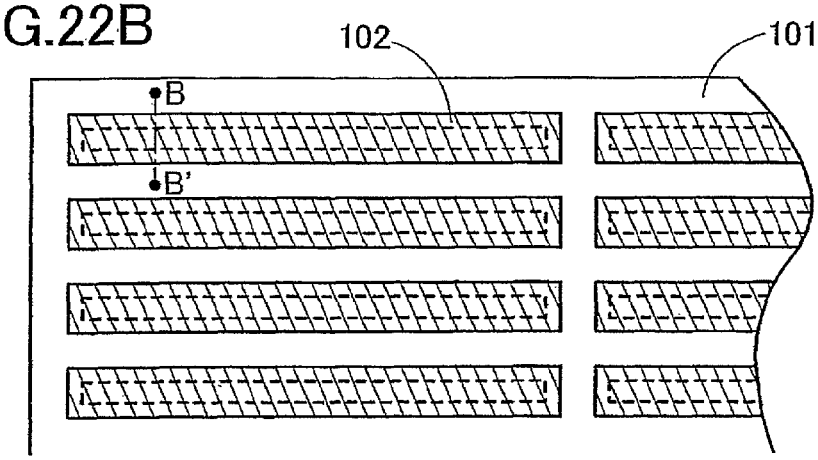

As illustrated in FIGS. 22A, 22B, a thin film serving as the release film 102 is formed by a photolithography method or an etching method in a region where each of the integrated circuits 100 is formed. FIG. 22B is a top view of the substrate 101, whereas FIG. 22A is a cross-sectional view of FIG. 22B taken along broken line B-B'.

Rectangular regions indicated by dotted line in the release film 102 in FIG. 22B are eventually provided with integrated circuits 100. There is an advantage of removing the release film 102 easily by etching preliminarily the release film 102 to remove unnecessary portions. If there is no need, the release film 102 can remain over the entire surface of the substrate 101 without being etched.

As the thin film serving as the release film 102, a single layered film made from an element selected among tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), plumbum (Pb), osmium (Os), iridium (Ir), or silicon (Si); an alloy material containing the foregoing element as its main component; or a compound material containing the foregoing element as its main component can be used. Alternatively, a laminated film composed of films selected from the foregoing single layered film can be used. A crystalline structure of a layer containing silicon may be any one of an amorphous structure, a microcrystalline structure, or a polycrystalline structure. As a method for depositing the thin film serving as the release film 102, a known deposition method such as a sputtering method or a plasma CVD method can be used.

As the release film 102, a single layered film made from a material selected among tungsten, molybdenum, a mixture of tungsten and molybdenum, an oxide of tungsten or molybdenum, a nitride of tungsten or molybdenum, an oxynitride of tungsten or molybdenum, an oxide of a mixture of tungsten and molybdenum, a nitride of a mixture of tungsten and molybdenum, or a oxynitride of a mixture of tungsten and molybdenum. Alternatively, a multilayered film composed of films selected from the foregoing single layered films. The mixture of tungsten and molybdenum corresponds to an alloy of tungsten and molybdenum. The oxide of tungsten may be referred to as tungsten oxide.

In the case that the release film 102 is formed by stacking a tungsten oxide layer over a tungsten layer, the phenomenon that a layer containing an oxide of tungsten is formed at an interface between a silicon oxide film and a tungsten layer when the silicon oxide film is formed over a top surface of the tungsten layer can be utilized. In the case that a nitride of tungsten is formed as the second layer, a silicon nitride film is formed. In the case that an oxynitride of tungsten is formed as the second layer, a silicon oxynitride film is formed. In that case, the silicon oxide film, the silicon nitride film, and the silicon oxynitride film can be used as an insulating film 103 to be hereinafter described.

Figure 22C:
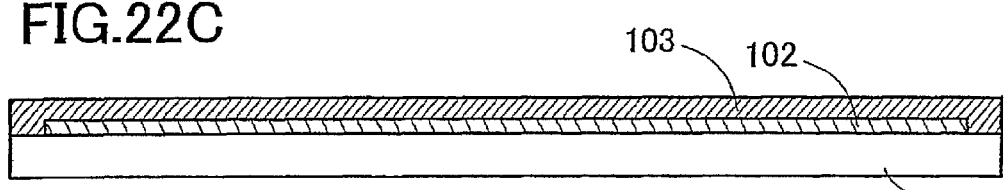

As illustrated in FIG. 22C, an insulating film 103 is formed to cover a top surface of the substrate 101 via the release film 102. The insulating film 103 serves as a base film and a blocking film for preventing penetration of impurities. For example, a single layered film or a multilayered film of a silicon oxide film, a silicon nitride film or a silicon oxynitride film is formed as the insulating film 103.

An example of forming insulating film 103 by a multilayered film is explained. Two layers of silicon oxynitride films are formed having different composition ratios of nitrogen, silicon, and oxygen. A bottom layer of the silicon oxynitride film is formed to have a larger amount of nitrogen than that of a top layer of the silicon oxynitride film. In the case of three layered structure, a silicon oxide film is formed as the first layer from the top and silicon oxynitride films having different composition ratios are formed as the second and third layers, in which a film having a larger amount of nitrogen than that of the other films is formed at the substrate side.

Figure 22D:
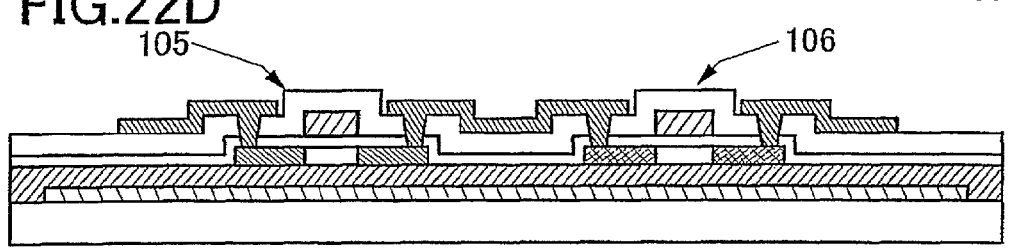

As illustrated in FIG. 22D, the integrated circuit having a desired function is formed by forming a transistor, condenser, resistance, and the like over the insulating film 103. In FIG. 22D, an inverter composed of an n-channel type thin film transistor 105 and a p-channel type thin film transistor 106 is superficially illustrated.

Figure 22E:
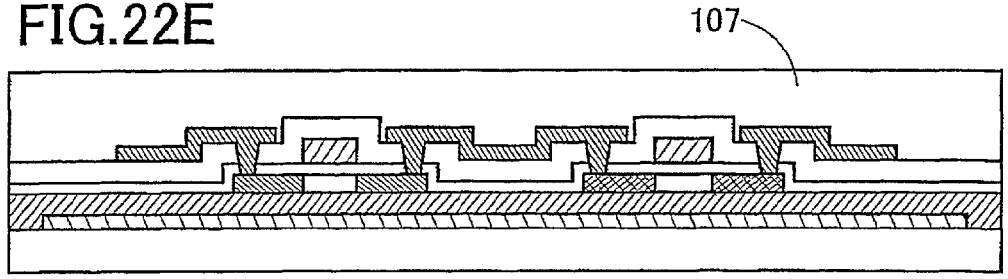

As illustrated in FIG. 22E, an insulating film 107 covering the integrated circuit composed of the n-channel type thin film transistor 105 and the p-channel type thin film transistor 106 is formed. The insulating film 107 is formed by a single layer or a laminated layer of an insulating film made from an inorganic material or an organic material. The insulating film 107 is preferably formed so that unevenness of the integrated circuit due to the thin film transistor can be flattened. Therefore, at least one layer of the insulating film 107 is preferably formed by an organic resin film such as acrylic, polyimide, or polyamide, or an insulating film made from an inorganic material such as an SOG film formed by coating solution.

Figure 23A:
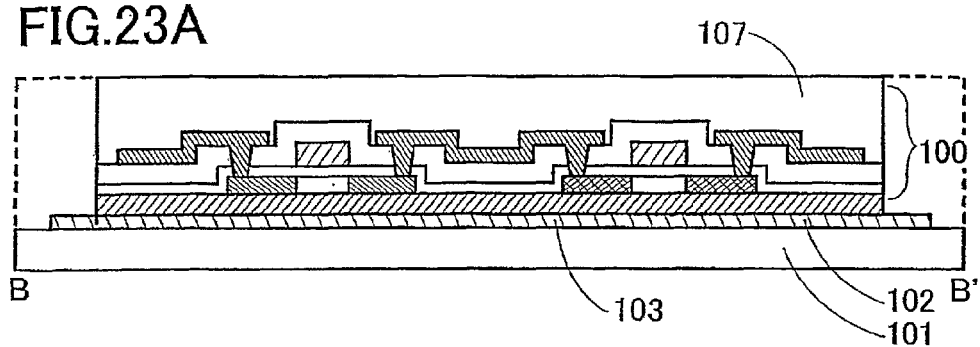
FIGS. 23A to 23D are explanatory views for showing a method for manufacturing a flexible integrated circuit (Embodiment 5)
Figure 23B:
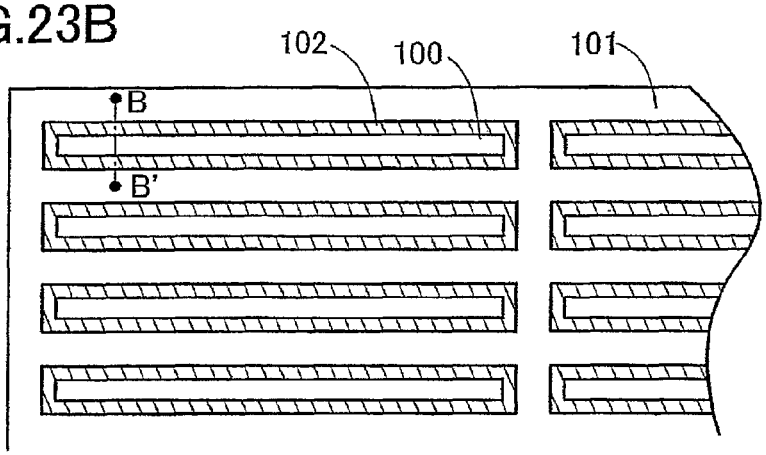

As illustrated in FIGS. 23A and 23B, a laminated material including the insulating film 103 formed over the release film 102 is etched so that the release film 102 is exposed to separate the integrated circuits 100 from each other. FIG. 23B is a top view of the substrate 101, whereas FIG. 23A is a cross-sectional view of FIG. 23B taken along broken line B-B'.

Figure 23C:
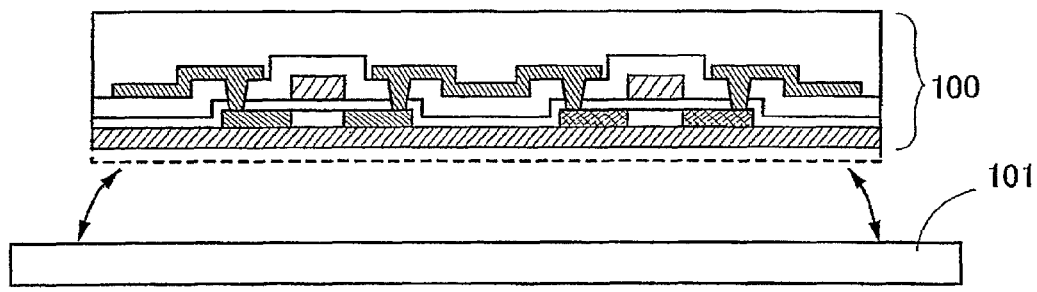

Then, the release film 102 is removed. In this embodiment, the release film 102 is etched away. In the case that the release film 102 is formed by the foregoing material, gas or liquid containing halogen fluoride or an interhalogen compound can be used as an etching agent. For example, trifluoride chloride ($ClF_3$) gas can be used. As illustrated in FIG. 23C, the integrated circuit 100 is separated and peeled from the substrate 101 by etching the release film 102. As a result, the integrated circuit 100 itself has flexibility.

Figure 23D:
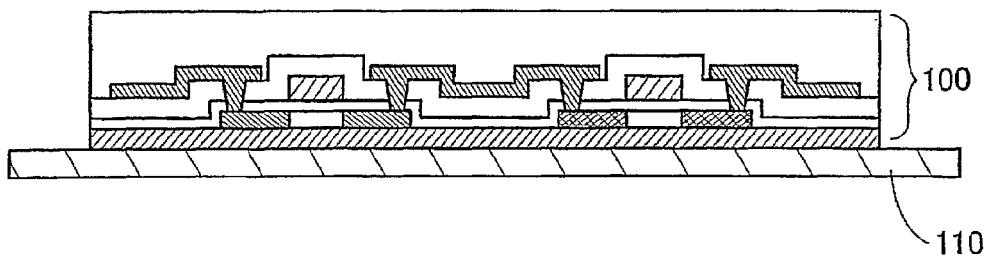

As illustrated in FIG. 23D, a substrate 110 is fixed to one surface of the integrated circuit 100 which is separated from the substrate 101. The substrate 110 is a flexible substrate and corresponds to the resin film 14 in Embodiments 1, 2 (refer to FIG. 2 or the like). In this embodiment, the substrate 110 is fixed to the insulating film 103 side; however, the substrate 110 can also be fixed to the insulating film 107 side. As illustrated in FIG. 2, the strip-shaped or line shaped integrated circuits 100 are arranged in parallel over the substrate 110.

In accordance with the process explained in Embodiments 1, 2, an IC chip with an antenna can be manufactured by using the flexible integrated circuit 100 over the substrate 110. Connecting portions to antennas of the integrated circuits 100 are formed in a general manufacturing process of a thin film transistor or after moving the integrated circuits 100 to the substrate 110.

As the substrate 110, a flexible substrate other than the resin film 14 for manufacturing an IC chip can be used. For example, a film made from a fibrous material such as paper, a base material film (polyester, polyamide, an inorganic deposited film, paper, or the like), an adhesive synthetic resin film (acrylic synthetic resin, epoxy synthetic resin, or the like) can be used.

Embodiment 6

In Embodiment 5, a release film 102 is etched off completely with an etching agent to peel an integrated circuit 100 from a substrate 101 (refer to FIG. 23C). An example of stopping etching at the state that a part of the release film 102 remains without removing completely the release film 102 is explained in this embodiment.

Figure 24A:
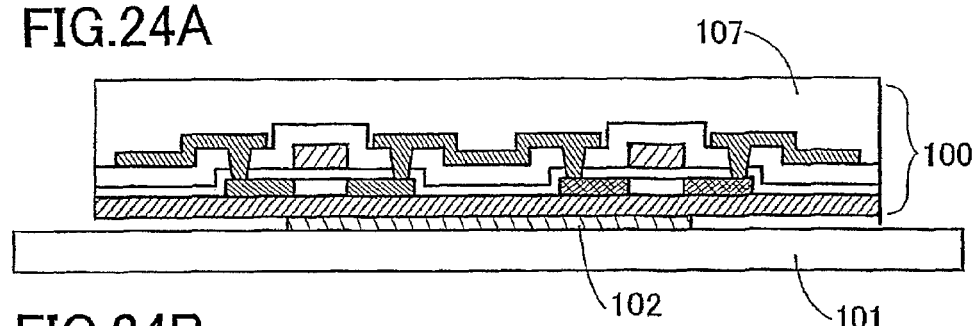
FIGS. 24A to 24C are explanatory views for showing a method for manufacturing a flexible integrated circuit (Embodiment 6)

After a process illustrated in FIG. 23A, etching is stopped at the state that a part of the release film 102 remain as illustrated in FIG. 24A.

Figure 24B:
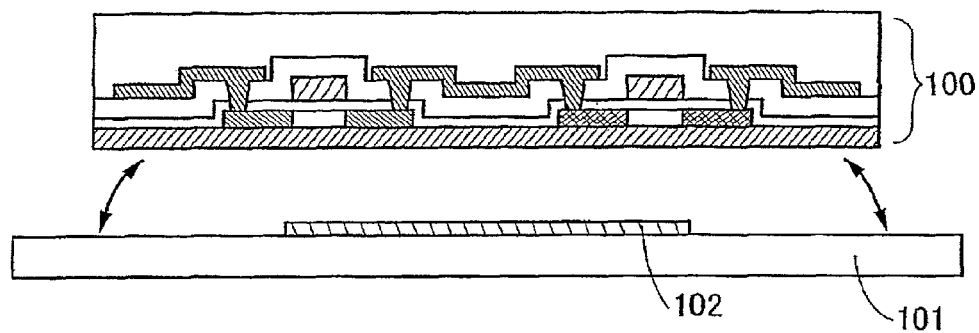

As illustrated in FIG. 24B, a substrate 121 is fixed to an insulating film 107 side. Then, the integrated circuit 100 is peeled to be separated from the substrate 101 by being applied with mechanical force from outside such as wind pressure of gas or ultrasonic waves. Although FIG. 24B illustrates that the release film 102 is completely removed from the integrated circuit 100, the release film 102 can remain at the integrated circuit 100 side.

Figure 24C:
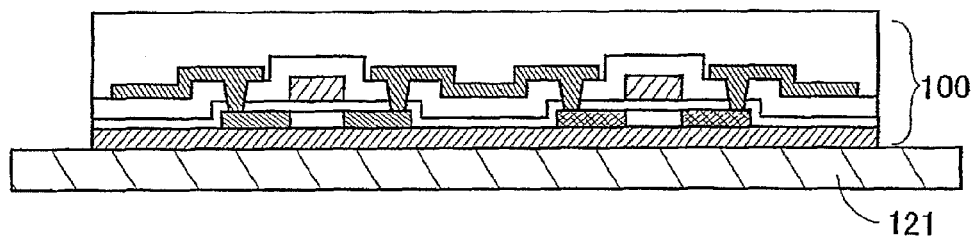

A substrate 121 is fixed to the insulating film 103 side or the insulating film 107 side of the integrated circuit 100 which is peeled and separated from the substrate 101. FIG. 24C illustrates an example of fixing the substrate 121 to the insulating film 103 side. The substrate 121 corresponds to a resin film 14 in Embodiments 1 and 2. Of course, a flexible substrate other than the resin film 14 can be used as the substrate 121.

Embodiment 7

A product using an IC chip with an antenna (wireless chip) and its usage are explained in this embodiment with reference to FIGS. 25A to 27.

Figure 25A:
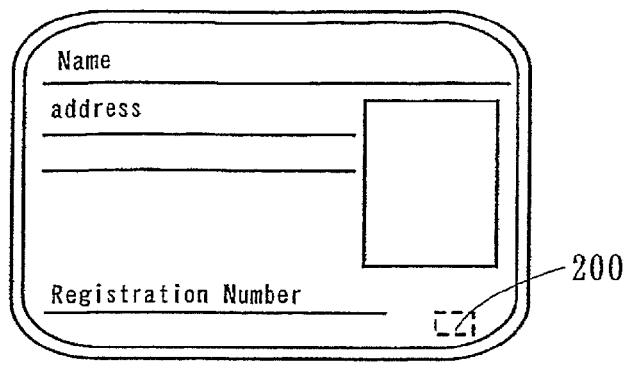
FIGS. 25A to 25E are explanatory views for showing products using a wireless chip (Embodiment 7)
Figure 25B:
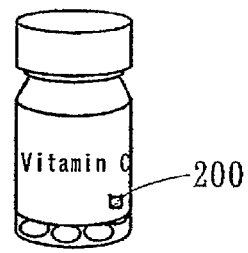
Figure 25C:
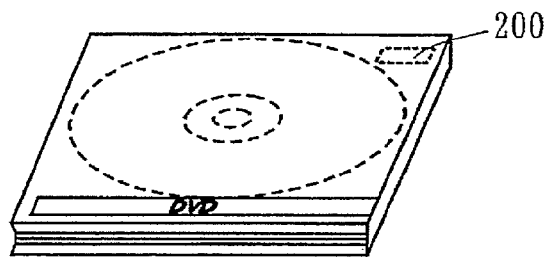
Figure 25D:
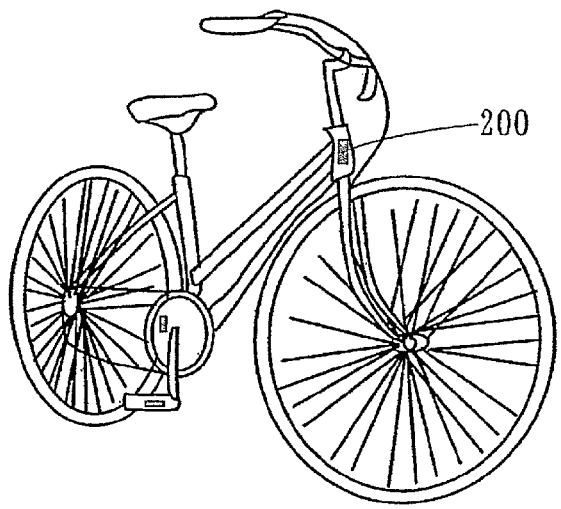
Figure 25E:
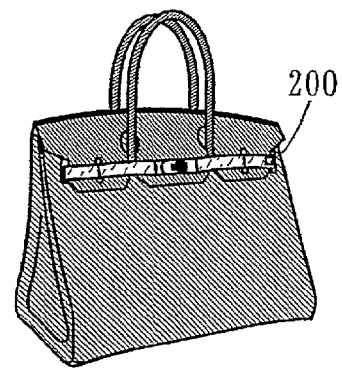

For example, the IC chip can be used by pasting to paper money, coins, securities, bearer bonds, certificates such as driver's license or residence certificate (FIG. 25A), packing containers such as wrapping paper or a bottle (FIG. 25B), a recording medium such as DVD software or a video tape (FIG. 25C), vehicles such as a bicycle (FIG. 25D), commodities such as a bag or glasses (FIG. 25E). Moreover, various products such as foods, garments, livingware, or electronic appliances can be provided with the IC chip. The electronic appliances represent a liquid crystal display device, an EL display device, a television device (also referred to as TV, TV receiver, or television receiver), a cellular phone, and the like. Each reference numeral 200 in FIGS. 25A to 25E indicates a wireless chip.

The IC chip is fixed to products by pasting over the surfaces of the products or embedding in the products. For example, the IC chip is embedded in a paper of a book or in organic resin of a package made from the organic resin. In the case of the paper money, the coins, the securities, the bearer bonds, the certificates, or the like, the IC chip can be pasted to the surface or embedded in the products. Since the wireless chip according to the present invention has flat surfaces, the wireless chip can be mounted to a product without being damaged its design.

The efficiency in an inspection system or a system used in a rental shop can be promoted by providing the wireless chip to the packing containers, the recording medium, the commodities, the foods, the garment, the livingware, the electronic appliances, and the like.

Figure 26:
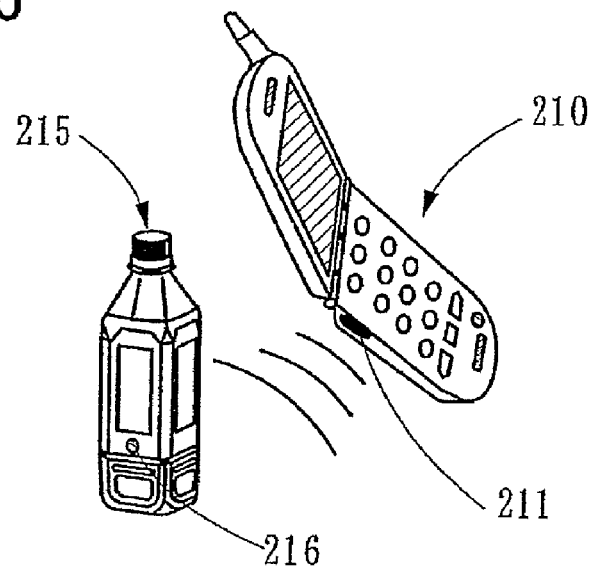
FIG. 26 is an explanatory view for showing a system using a wireless chip (Embodiment 7)
Figure 27:
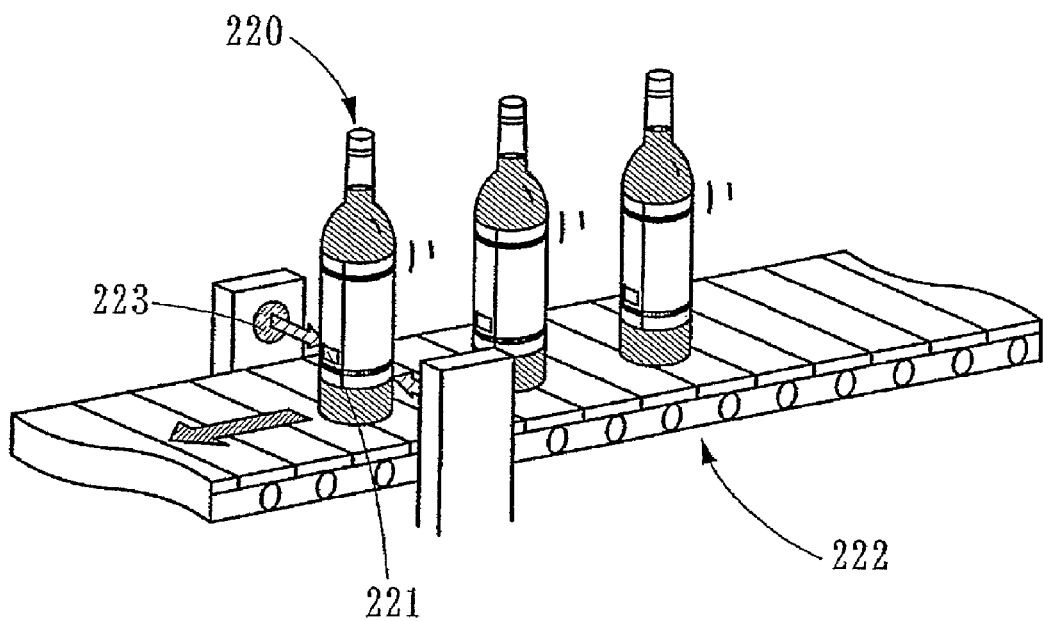
FIG. 27 is an explanatory view for showing a system using a wireless chip (Embodiment 7).

FIGS. 26 and 27 illustrate an example of a system for controlling inspection or distribution of products by using the wireless chip. As illustrated in FIG. 26, a reader/writer 211 is provided to a side face of a portable terminal 210 having a display portion such as a cellular phone. On the other hand, a wireless chip 216 is provided to a product 215. A system in which information on a raw material, a place of origin, a distribution process, or the like of the product 215 can be displayed on the display portion of the portable terminal 210 when the reader/writer 295 is held over the wireless chip 216 can be constructed.

As illustrated in FIG. 27, a wireless chip 221 is preliminarily provided to a product 220 to be inspected. By providing a reader/writer 223 to the side of a belt conveyor 222, inspection of the product 220 can be easily carried out by the reader/writer 223. An inspection result can be written in the wireless chip 221 via the reader/writer 223.

EXPLANATION OF REFERENCE

11: conductive film; 12: integrated circuit; 13: resin film; 14: resin film; 15: connecting portion; 17: IC chip; 18: film; 31: conductive film; 37: IC chip; 41: conductive film; 42: resin film; 45: antenna; 46: integrated circuit; 47: IC chip; 48: film; 51: conductive film; 52: resin film; 53: conductive film (second pattern); 54: conductive film (first pattern); 54': conductive film (first pattern); 55: antenna; 100: integrated circuit; 101: substrate; 102: release film; 103: insulating film; 107: insulating film; 110: substrate; 121: substrate; 200: wireless chip; 210: portable terminal; 211: reader/writer; 215: product; 216: wireless chip; 220: product; 221: wireless chip; 222: belt conveyor; and 223: reader/writer.

What is claimed is:

1. A method for manufacturing an IC chip comprising:
   rolling a laminated body formed by stacking a conductive film, a first resin film, a plurality of integrated circuits, and a second resin film so that the second resin film is outside;
   softening the first resin film and the second resin film and fixing the laminated body in a roll form in a state that the conductive film is electrically connected to the plurality of integrated circuits; and
   cutting the laminated body along with a direction in which a roll of the laminated body appears in a cross-section.

2. The method for manufacturing an IC chip according to claim 1, wherein the conductive film is sheet-like.

3. The method for manufacturing an IC chip according to claim 1, wherein the conductive film has a plurality of strip-like or line-like first patterns in parallel between a pair of strip-like or line-like second patterns.

4. The method for manufacturing an IC chip according to claim 1, wherein the first resin film and the second resin film comprises the same materials.

5. A method for manufacturing an IC chip comprising:
   rolling a laminated body formed by stacking a plurality of integrated circuits, a first resin film, a conductive film, and a second resin film so that the second resin film is outside;
   softening the first resin film and the second resin film and fixing the laminated body in a roll form in a state that the conductive film is electrically connected to the plurality of integrated circuits; and
   cutting the laminated body along with a direction in which a roll of the laminated body appears in a cross-section.

6. The method for manufacturing an IC chip according to claim 5, wherein the conductive film is sheet-like.

7. The method for manufacturing an IC chip according to claim 5, wherein the conductive film has a plurality of strip-like or line-like first patterns in parallel between a pair of strip-like or line-like second patterns.

8. The method for manufacturing an IC chip according to claim 5, wherein the first resin film and the second resin film comprises the same materials.

9. A method for manufacturing an IC chip comprising:
   rolling a laminated body formed by stacking a plurality of conductive films, a first resin film, a plurality of integrated circuits, and a second resin film so that the second resin film is outside;
   softening the first resin film and the second resin film and fixing the laminated body in a roll form in a state that the plurality of conductive films is electrically connected to one of the plurality of integrated circuits; and
   cutting the laminated body along with a direction in which a roll of the laminated body appears in a cross-section.

10. The method for manufacturing an IC chip according to claim 9, wherein the first resin film and the second resin film comprises the same materials.

11. A method for manufacturing an IC chip comprising:
    rolling a laminated body formed by stacking a plurality of integrated circuits, a first resin film, a plurality of strip-like or line-like conductive films, and a second resin film so that the second resin film is outside;
    softening the first resin film and the second resin film and fixing the laminated body in a state that the plurality of conductive films is electrically connected to one of the plurality of integrated circuits; and
    cutting the laminated body along with a direction in which a roll of the laminated body appears in a cross-section.

12. The method for manufacturing an IC chip according to claim 11, wherein the first resin film and the second resin film comprises the same materials.

* * * * *